United States Patent [19]
Graul et al.

[11] 4,082,571
[45] Apr. 4, 1978

[54] PROCESS FOR SUPPRESSING PARASITIC COMPONENTS UTILIZING ION IMPLANTATION PRIOR TO EPITAXIAL DEPOSITION

[75] Inventors: Juergen Graul, Gruenwald; Helmuth Murrmann, Ottobrunn, both of Germany

[73] Assignee: Siemens Aktiengesellschaft, Berlin & Munich, Germany

[21] Appl. No.: 647,857

[22] Filed: Jan. 9, 1976

[30] Foreign Application Priority Data

Feb. 20, 1975 Germany ............................ 2507366

[51] Int. Cl.² ................. H01L 21/265; H01L 21/324; H01L 21/20
[52] U.S. Cl. ..................................... 148/1.5; 148/175; 148/187; 148/191; 357/35; 357/40; 357/46; 357/50; 357/91
[58] Field of Search .................. 148/1.5, 187, 175; 357/50, 91

[56] References Cited

U.S. PATENT DOCUMENTS

| T918,008 | 1/1974 | Brack et al. ............... 148/1.5 X |
| 3,457,632 | 7/1969 | Dolan, Jr. et al. ............ 148/1.5 X |
| 3,515,956 | 6/1970 | Martin et al. ............... 148/1.5 X |
| 3,533,857 | 10/1970 | Mayer et al. ............... 148/1.5 |
| 3,622,382 | 11/1971 | Brack et al. ............... 148/1.5 X |
| 3,666,548 | 5/1972 | Brack et al. ............... 148/1.5 X |
| 3,840,409 | 10/1974 | Ashar ....................... 148/1.5 |
| 3,849,204 | 11/1974 | Fowler ...................... 148/1.5 |

*Primary Examiner*—L. Dewayne Rutledge
*Assistant Examiner*—W. G. Saba
*Attorney, Agent, or Firm*—Hill, Gross, Simpson, Van Santen, Steadman, Chiara & Simpson

[57] ABSTRACT

A process for suppressing parasitic components, in particular parasitic diodes and transistors, in integrated circuits which have, in particular, inversely operated transistors, in which a semiconductor substrate of the first conductivity type as introduced therein a highly doped zone of a second conductivity type which is opposite to the first conductivity type and which extends to a surface of the semiconductor substrate. A semiconductor layer of the second conductivity type is epitaxially deposited on the surface and the semiconductor layer further has produced therein zones of differing conductivity type which form at least one component which is electrically insulated from adjacent components. Prior to the deposition of the semiconductor layer, at least one highly ohmic layer and/or a layer having a high density of recombination centers is introduced by ion implantation into the surface of the semiconductor substrate at points suitable for the suppression of the parasitic components which form subsequently due to the production of the zones of differing conductivity type in the semiconductor layer.

13 Claims, 1 Drawing Figure

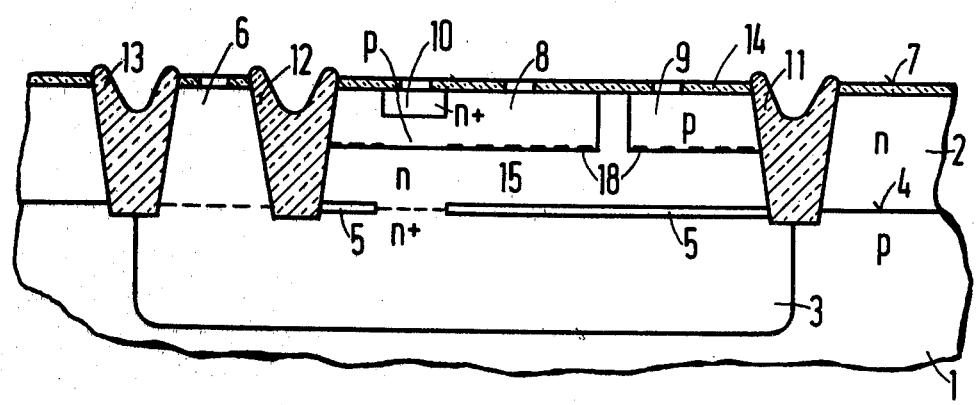

PROCESS FOR SUPPRESSING PARASITIC COMPONENTS UTILIZING ION IMPLANTATION PRIOR TO EPITAXIAL DEPOSITION

BACKGROUND OF THE INVENTION

1. Field of the Invention

This invention relates to a process for suppressing parasitic components, in particular parasitic diodes and transistors, in integrated circuits which possess, in particular, inversely operated transistors, and more particularly to such a process in which a highly doped zone is introduced into a semiconductor substrate of a first conductivity type, the highly doped zone being of an opposite, second conductivity type and extending to a surface of the semiconductor substrate, and in which a semiconductor layer of the second conductivity type is epitaxially deposited on the surface and further zones of different conductivity types are produced in the semiconductor layer to form at least one component which is electrically insulated from adjacent components.

2. Description of the Prior Art

In integrated circuits, parasitic diodes and transistors exert a considerable influence over the switching performance of the circuits. This applies, in particular, to the so-called "MTL-or I$^2$L circuits" (merged-transistor-logic and integrated-injection-logic), in which transistors are inversely operated. In an inversely operated transistor, in contrast to a transistor of the conventional planar technique, the emitter zone is not located on the surface of the semiconductor body, or in an epitaxial layer deposited on a semiconductor substrate, but in the semiconductor body itself, i.e. beneath the epitaxially deposited layer.

SUMMARY OF THE INVENTION

Therefore, the primary object of the invention is to provide a process for suppressing parasitic components which greatly reduces the effects of the parasitic pn junctions, while at the same time providing facilities for precise localization.

The object objective is achieved, according to the invention, in that prior to the deposition of the epitaxially deposited semiconductor layer, at least one highly ohmic layer and/or a layer having a high density of recombination centers is introduced by ion implantation into the surface of the semiconductor substrate at suitable positions for the suppression of the parasitic components.

The effects of parasitic components, in particular parasitic diodes and transistors, therefore the effects of parasitic pn junctions, can be reduced by preventing charge carrier injections at the pn junction and/or by enabling a recombination of already injected charge carriers. The highly ohmic (insulating or semi-insulating) layer reduces an injection of charge carriers at the pn junction, whereas the layer possessing a high density of recombination centers leads to a recombination of already injected charge carriers.

As the highly ohmic layer and/or the layer having a high density of recombination centers is produced by ion implantation, the boundaries of these layers can be precisely localized.

Materials suitable for producing the layers by means of ion implantation are those which, in association with lattice gaps, form ionized interstitial complexes which are difficult to heal, therefore, for example, oxygen, or else materials which form chemical compounds with the atoms of the semiconductor substrate for example in form of molecules, such as, for example, nitrogen, oxygen or carbon ions.

A further development of the invention resides in the provision of additionally introduced ions of the second conductivity type into the surface of the semiconductor substrate, which ions possess a higher diffusion coefficient than the doping material of the highly doped zone of the second conductivity type, so that during a following temperature treatment subsequent to the deposition of the semiconductor layer, the doping material having the higher diffusion coefficient diffuses further into the semiconductor layer.

Because of their higher diffusion coefficient, the additionally introduced ions of the second conductivity type diffuse further into the semiconductor layer and thus reduce the distance between the highly doped zone and a base zone which is yet to be formed in the semiconductor layer, as a result of which, in an inversely operated transistor, the emitter efficiency is increased and the emitter-base capacitance is reduced.

BRIEF DESCRIPTION OF THE DRAWINGS

Other objects, features and advantages of the invention, its organization, construction and operation will be best understood from the following detailed description taken in conjunction with the accompanying drawing on which there is a single FIGURE of a schematic representation of an inversely operated transistor constructed in accordance with the present invention.

DESCRIPTION OF THE PREFERRED EMBODIMENTS

Referring to the drawing, a p-doped semiconductor substrate 1 has a surface 4 on which an epitaxially deposited n-doped semiconductor layer 2 is arranged. A highly n-doped zone 3 is arranged in the semiconductor substrate 1 and is connected via a highly n-doped connecting zone 6 to the surface of the semiconductor layer 2. Additional p-doped zones 8 and 9 are provided in the semiconductor layer 2. Finally, a highly n-doped zone 10 is arranged in the zone 8.

Adjacent components are insulated by means of silicon dioxide layers (thick oxide) 11 and 13 which extend into the semiconductor substrate 1. Another silicon dioxide layer 12 bounds the zone 8 and thus reduces its surface.

Also arranged on the surface 7 is a silicon dioxide layer 14 which is provided with windows to the connecting zones 6 and to the zones 8, 9 and 10.

The zone 3 and a region 15 of the semiconductor layer 2 between the zone 3 and the zone 8 represent the emitter zone of an inversely operated transistor. The zone 8 is the base zone, whereas the zone 10 forms the collector zone. Finally, the zone 9 represents the injector which is able to inject defect electrons (holes) which act as control current for the base zone of the transistor.

The transistor represented on the drawing is a npn transistor. In addition, however, the zone 8, the semiconductor layer 2, the zone 3 and the zone 9 form a parasitic pnp transistor. This parasitic transistor has the parasitic pn junctions 18. The effects of these parasitic pn junctions are suppressed by the provision of a highly ohmic layer 5 which is introduced into the surface of the semiconductor substrate 1 prior to the deposition of the epitaxial semiconductor layer 2.

According to the present invention, the layer 5 is produced in the following manner.

After the production of the zone 3 (buried layer) by means of diffusion or implantation, nitrogen ions are locally implanted by masking in the region of the parasitic pn junctions 18 in such a dose that the maximum nitrogen doping corresponds to a Gaussian distribution amounts to approximately $5 \times 10^{21}$ cm$^{-3}$. Here, the implantation energy is selected to be such that the nitrogen concentration at the surface does not fundamentally impair a regeneration of the crystal lattice during a following thermal healing step. Therefore, for example, an implantation energy level of approximately 150 keV, with a dose of $10^{17}$ cm$^{-2}$ produces a surface concentration of the nitrogen ions which is less than $10^{18}$ cm$^{-3}$. At a healing temperature which is greater than 1000° C, the crystal lattice damaged by the implantation of the layer 5 can be regenerated at its surface 4 to such an extent that the semiconductor layer 2 can be subsequently deposited in the conventional manner.

This temperature treatment leads to a partial linking of the implanted nitrogen ions with the silicon atoms of the semiconductor substrate 1. A mixture of silicon, nitrogen and silicon nitrides is formed which exhibits such a marked lattice inhomogeneity that the effects of the parasitic pn junctions 18 are largely suppressed.

The improved process of the present invention is particularly suitable for the production of npn and pnp transistors.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a process for suppressing parasitic components, in particular parasitic diodes and transistors, in circuits which possess, in particular, inversely operated transistors, in which a highly doped zone of a second conductivity is introduced into and extends to a surface of a semiconductor substrate of a first conductivity type which is opposite the second conductivity type, in which a semiconductor layer of the second conductivity type is epitaxially deposited on the surface, and in which zones of differing conductivity types are produced in the semiconductor layer to form at least one component which is electrically insulated from adjacent components, the improvement therein comprising:

prior to deposition of the semiconductor layer, forming a layer for controlling the number of charge carriers at parasitic pn junctions subsequently formed by the semiconductor layer and the zones produced therein by implanting ions into the surface of the semiconductor substrate at points suitable to suppress parasitic components while simultaneously chemically reacting the ions with the atoms of the substrate to form molecules, controlling the implantation energy to obtain an implantation concentration at the surface of the substrate which will not impair regeneration of the crystal lattice during a following healing step, and thermally healing the surface of the substrate.

2. The improved process of claim 1, wherein the step of forming a layer is further defined as:

implanting ions to form a highly ohmic layer.

3. The improved process of claim 1, wherein the step of forming a layer is further defined as:

implanting ions to form high density recombination centers.

4. The improved process of claim 1, wherein the step of forming a layer is further defined as:

implanting ions and forming therewith, in combination with lattice gaps in said substrate, ionized interstitial complexes which are difficult to heal.

5. The improved process of claim 4, wherein the step of implanting ions is further defined as:

implanting oxygen ions.

6. The improved process of claim 1, wherein the step of forming a layer is further defined as:

implanting oxygen ions.

7. The improved process of claim 1, wherein the step of forming a layer is further defined as:

implanting carbon ions.

8. The improved process of claim 1, wherein the step of forming a layer is further defined as:

implanting nitrogen ions.

9. The improved process of claim 1, wherein the step of implanting ions is further defined as:

implanting nitrogen ions to obtain a maximum doping concentration of $5 \times 10^{21}$ cm$^{-3}$.

10. The improved process of claim 1, wherein the step of implanting ions and controlling implantation energy are further defined as:

implanting nitrogen ions with an implantation energy of 150 keV.

11. The improved process of claim 10, wherein the step of implanting nitrogen ions is further defined as implanting nitrogen ions to obtain a concentration of $10^{18}$ cm$^{-3}$.

12. The improved process of claim 11, wherein the step of thermally healing the surface is further defined as:

healing the surface at a temperature of $\geq$ 1000° C.

13. The improved process of claim 14, comprising the further steps of:

introducing ions of the second conductivity type into the substrate and of a higher diffusion coefficient than that of the doping material of the highly doped zone; and heating the substrate, subsequent to the deposition of the semiconductor layer, to cause the material of the higher diffusion coefficient to diffuse farther into the semiconductor layer.

* * * * *